United States Patent
Hsieh

(10) Patent No.: US 10,297,522 B2
(45) Date of Patent: May 21, 2019

(54) SEMICONDUCTOR PACKAGE STRUCTURE AND MANUFACTURING METHOD THEREOF

(71) Applicant: NIKO SEMICONDUCTOR CO., LTD., New Taipei (TW)

(72) Inventor: Chih-Cheng Hsieh, Taoyuan (TW)

(73) Assignee: NIKO SEMICONDUCTOR CO., LTD., New Taipei (TW)

( * ) Notice: Subject to any disclaimer, the term of this patent is extended or adjusted under 35 U.S.C. 154(b) by 0 days.

(21) Appl. No.: 16/022,947

(22) Filed: Jun. 29, 2018

(65) Prior Publication Data

US 2018/0308781 A1 Oct. 25, 2018

Related U.S. Application Data

(62) Division of application No. 15/439,464, filed on Feb. 22, 2017, now Pat. No. 10,043,728.

(30) Foreign Application Priority Data

Mar. 4, 2016 (TW) .............................. 105106700 A

(51) Int. Cl.
*H01L 23/367* (2006.01)
*H01L 23/498* (2006.01)
*H01L 23/538* (2006.01)
*H01L 23/373* (2006.01)
*H01L 21/52* (2006.01)
*H01L 23/36* (2006.01)
*H02P 27/06* (2006.01)

(52) U.S. Cl.
CPC ............ *H01L 23/367* (2013.01); *H01L 21/52* (2013.01); *H01L 23/36* (2013.01); *H01L 23/3735* (2013.01); *H01L 23/49811* (2013.01); *H01L 23/49844* (2013.01); *H01L 23/5385* (2013.01); *H02P 27/06* (2013.01)

(58) Field of Classification Search
CPC ....... H01L 2924/00; H01L 2924/13055; H01L 2924/13091; H01L 2224/48247; H01L 2924/181; H01L 2224/73265; H01L 25/072; H01L 2924/014; H01L 25/071; H01L 23/367; H01L 21/52; H01L 23/3735; H01L 23/49844; H05K 7/209; H05K 7/20509; Y10T 29/49002; H02P 27/06
USPC ...................................................... 257/690
See application file for complete search history.

(56) References Cited

U.S. PATENT DOCUMENTS

2013/0020694 A1* 1/2013 Liang .................... H01L 25/072
257/691

* cited by examiner

*Primary Examiner* — Caleen O Sullivan
(74) *Attorney, Agent, or Firm* — Li & Cai Intellectual Property (USA) Office

(57) ABSTRACT

A semiconductor package structure and manufacturing method thereof are provided. Firstly, a first surface mounting unit, a first printed circuit board, and a second printed circuit board are provided. The first surface mounting unit includes a first chip and a first conductive frame, and the first conductive frame has a first carrier board and a first metal member connected to the first carrier board. A first side of the first chip is electrically connected to the first carrier board of the first conductive frame. A second side of the first chip and the first metal member are connected to the first circuit board by a first pad and a second pad respectively. The second circuit board is connected to the first carrier board and hence, the first surface mounting unit is located between the first circuit board and the second circuit board.

8 Claims, 10 Drawing Sheets

SEMICONDUCTOR PACKAGE STRUCTURE AND MANUFACTURING METHOD THEREOF

CROSS REFERENCE TO RELATED APPLICATIONS

This application is a divisional application of Ser. No. 15/439,464 filed on Feb. 22, 2017, and entitled "SEMICONDUCTOR PACKAGE STRUCTURE AND MANUFACTURING METHOD THEREOF", now pending, the entire disclosures of which are incorporated herein by reference.

BACKGROUND

1. Technical Field

The instant disclosure relates to a semiconductor packaging process, in particular, to a semiconductor package structure with double-side cooling function and the manufacturing method thereof.

2. Description of Related Art

Highly integrated and miniaturized semiconductor products are trending consumer products, and widely used in the motor controlling field. The use of brushless DC motors (BLDC) in motor electronics and medical products has increased, and the ratio in the market thereof exceeds other types of motors. Along with the increased need for BLDC and the development of the related motor techniques, the development strategy of the motor control systems has changed from independent circuit forms to power module forms.

A basic motor system is shown in FIG. 16 and comprises three main units: a power electronic element, a gate driver and a control unit. In addition to packaging the discrete power electronics such as insulated gate bipolar transistor (IGBT), fast recovery diode (FRD) and metal-oxide-semiconductor field-effect transistor (MOSFET) with other related components and temperature detecting devices for forming a module, some applications integrate the gate driver into the module. Aside from completely integrating the three-phase control in the same module, in some larger electric current applications, the units are packaged into a single phase module. The above types of power modules are for the application of high current power and high current and hence, the semiconductor devices used therein will generate a large amount of heat. Therefore, the existing module packages have insufficient heat dissipation property and need additional heat dissipation structures for effectively dissipating heat.

Although existing techniques can operate and perform effectively, some disadvantages still exist. For example, U.S. publication No. 20090160044 and 20130020694 disclose the techniques relating to module packaging. The conventional power module manufacturing process mainly combines die attach and wire bonding processes. Furthermore, some methods including substituting aluminum wires with aluminum ribbons or using copper materials having better conductivity and heat dissipation ability such as copper ribbons to reduce wire resistance are also presented. Since the conventional manufacturing processes involve electrically connecting the power chips in the power module by wire bonding, the heat generated by the power chips cannot be effectively dissipated.

In addition, the use of wire bonding process increases the parasitic inductance and affects the operation frequency. Besides, the electromagnetic interference (EMI) induced by the parasitic inductance is a problem which cannot be ignored. For improving the heat dissipation property, a double-side cooling technique is provided and is used in the hybrids mobiles. However, such techniques still employ die attach for assembling the components and has the disadvantage of high manufacturing complexity, low yield, insufficient testing coverage for the chip and low feature matching, thereby causing inconsistency of performance.

Discrete component electronic circuits are convenient to assemble and have the advantage of low manufacturing cost and are suitable for mass production. Therefore, most of the circuit boards are produced in this way. Power modules have the advantage of excellent reliability and heat dissipation ability. There is a need to combine the advantage of the above two types of assembling technique to achieve a power module with double-side cooling property which is easy to produce.

SUMMARY

The problem to be solved of the instant disclosure is to provide a semiconductor package structure with double-side heat dissipation property and the manufacturing method thereof.

In order to solve the above technical problem, an embodiment of the instant disclosure provides a method for manufacturing a semiconductor package structure comprising: providing a first surface mounting element comprising a first chip and a first conductive frame, in which the first conductive frame comprises a first carrier board and a first metal member, the first carrier board and the first metal member connect with each other to form a first receiving area, the first chip is located at the first receiving area, and a first side of the first chip is connected to the first carrier board; providing a first circuit board to engage with the first surface mounting element, in which a second side of the first chip and the first metal member are connected to the first circuit board through a first pad and a second pad respectively; and providing a second circuit board to connect with the first carrier board, the first surface mounting element is located between the first circuit board and the second circuit board.

In one of the embodiments of the instant disclosure, the first pad and the second pad are connected to a same surface of the first circuit board.

In one of the embodiments of the instant disclosure, the first surface mounting element further comprises a first enhancing chip connected to the second side of the first chip through a metal layer on the first circuit board.

In one of the embodiments of the instant disclosure, the method further comprises forming a closed-loop metal ring disposed between the first circuit board and the second circuit board, and the closed-loop metal ring surrounds the first surface mounting element.

Another embodiment of the instant disclosure provides a semiconductor package structure comprising: a first surface mounting element, a first circuit board and a second circuit board. The first surface mounting element comprises a first conductive frame and a first chip, the first conductive frame comprises a first carrier board and a first metal member, the first carrier board and the first metal member connect with each other and form a first receiving area. The first chip is disposed in the first receiving area, a first side of the first chip is electrically connected to the first carrier board. The first circuit board engages with the first surface mounting element, a second side of the first chip and the first metal member are connected to the first circuit board through a first pad and a second pad respectively. The second circuit board is connected to the first carrier board, the first surface mounting element is located between the first circuit board and the second circuit board.

In one embodiment of the instant disclosure, the semiconductor package structure further comprises a second surface mounting element comprising a second conductive frame and a second chip. The second conductive frame comprises a second carrier board and a second metal member, the second carrier board and the second metal member connect with each other and form a second receiving area. The second chip is disposed in the second receiving area, a side of the second chip is electrically connected to the second carrier board. The second side of the second chip and the second metal member are connected to the first circuit board through a third pad and a fourth pad respectively.

The instant disclosure has at least the following effectiveness:
1. Providing double side cooling performance and has the advantage of low heat resistance.
2. Providing the technical effect of EMI-prevention.
3. Employing surface mounting technology (SMT), thereby significantly simplifying the manufacturing process and reducing the cost for mass production (MP).
4. Reducing the resistance, thereby satisfying the requirement for the high current in mobile electronic products.
5. The semiconductor package structure does not need to employ the wire bonding process used in conventional packaging process and hence, is convenient for producing and reworking and has higher reliability.
6. Compared to the existing art, the semiconductor package structure has smaller size and can receive more power chips.
7. The parasitic inductance produced by using the semiconductor package structure and the manufacturing method thereof is lower and the operation frequency is higher.

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DESCRIPTION OF THE EXEMPLARY EMBODIMENTS

Figure 1:
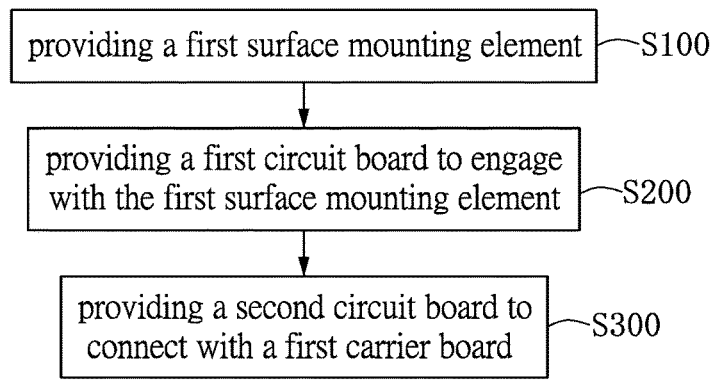
FIG. 1 is a first flow chart of the method for manufacturing a semiconductor package structure provided by the instant disclosure.

Reference will now be made in detail to the exemplary embodiments of the instant disclosure, examples of which are illustrated in the accompanying drawings. Wherever possible, the same reference numbers are used in the drawings and the description to refer to the same or like parts.

First Embodiment

Please refer to FIG. 1 to FIG. 4. FIG. 1 to FIG. 4 are the flow charts of the method for manufacturing a semiconductor package structure provided by the instant disclosure. The method provided by the instant disclosure can be applied to package elements of the same type of element of different types. The elements are, for example, power transistors, integrated circuit elements or diodes, etc. The most important power semiconductor components in the power module are usually IGBT or MOSFET, and can comprise FRD or the combination of other power elements. Such semiconductor components are usually formed of Si, SiC, GaN, GaAs or other suitable materials. The instant disclosure is described taking a power discrete device, MOSFET, as example.

In step S100, providing a first surface mounting element. Please refer to FIG. 9 to FIG. 12, the first surface mounting element 100 comprises a first chip 110 and a first conductive frame 120, in which the first conductive frame 120 comprises a first carrier board 121 and a first metal member 122 connected with each other. The first carrier board 121 and the first metal member 122 form a first receiving area 123. The first chip 110 is located at the first receiving area 123, and a first side 111 of the first chip 110 is electrically connected to the first carrier board 121, and the first metal member 122 and the second side 112 of the first chip 110 is on the same side.

In other words, one side of the first chip 110 is electrically connected to the first carrier board 121 of the first conductive frame 120, and the first metal member 122 of the first conductive frame 120 is located at the side of the first chip 110. Specifically, one end of the first metal member 122 is connected to the first carrier board 121, and the other end thereof is connected to the first circuit board 200 through the first pad 210. The other end of the first metal member 122 is on the same end of the second side 112 of the first chip 110. The other details of step S100 will be described further on.

In step S200, providing a first circuit board to engage with the first surface mounting element. Please refer to FIG. 9 to FIG. 12. The second side 112 of the first chip 110 and the first metal member 122 are connected to the first circuit board 200 through a first pad 210 and a second pad 220 respectively.

In other words, the first surface mounting element 100 is fixed on the first circuit board 200, the first side 111 of the first chip 110 is electrically connected to the first pad 210 through the first conductive frame 120, the second side 112 of the first chip 110 is electrically connected to the second pad 220, in which the first pad 210 and the second pad 220 can be arranged on the same surface of the first circuit board 200. The other details of step S200 will be described further on.

In step S300, providing a second circuit board 300 to connect with the first carrier board 121. The first surface mounting element 100 is located between the first circuit board 200 and the second circuit board 300. Please refer to FIG. 11 and FIG. 12. The other details of step S300 will be described further on.

Figure 2:
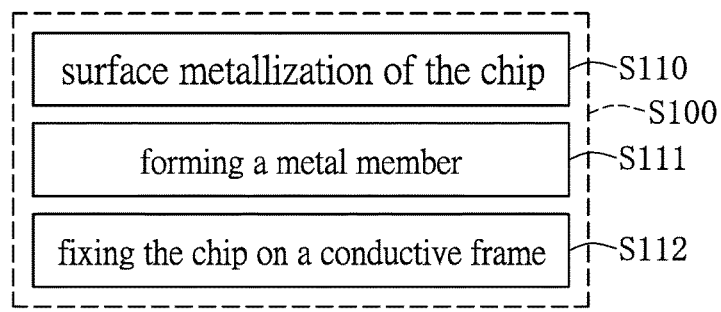
FIG. 2 is a second flow chart of the method for manufacturing a semiconductor package structure provided by the instant disclosure.

Please refer to FIG. 2. Step S100 further comprises: step S110, metalizing the surface of the chip; step S111, forming a metal member; and step S112, fixing the chip on the conductive frame 120.

Figure 11:
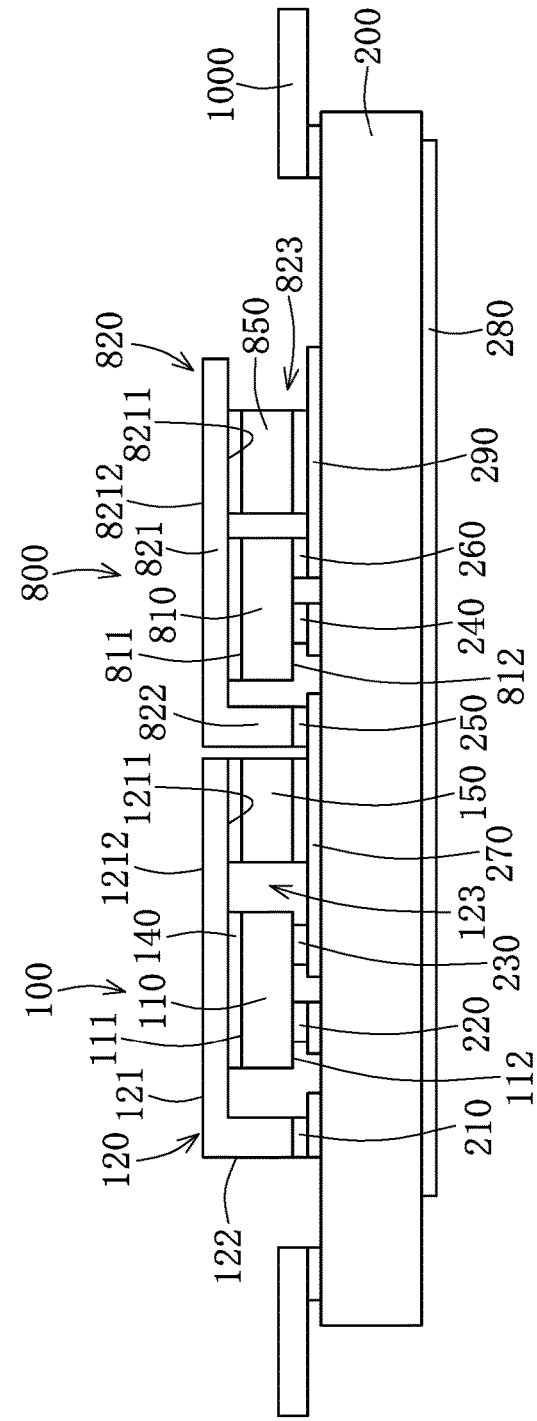
FIG. 11 is a first schematic view of the semiconductor package structure provided by the instant disclosure.

In step 110, providing a chip with surface metallization. For example, using a MOSFET as the first chip 110, the first side 111 of the first chip 110 is the drain and by attaching a conductive layer 140 on the first conductive frame 120, the second side 112 comprises the gate and the source, as shown in FIG. 11. The surfaces of the gate and the source have a second pad 220 corresponding to the gate and a third pad 230 corresponding to the source formed thereon respectively. Typical pads are metals such as aluminum and are unable to be directly connected to the solder used for circuit board soldering process and one of an electroless plating process, a sputtering process and an evaporation deposition must be used to metalize the surface of the first chip 110, thereby forming metal pads such as TiCu, NiPdAu and NiAu.

Please refer to FIG. 5 to FIG. 8. In step S111, the metal member can be formed on the conductive frame by one of the processes in the group consisting of etching, stamping, binding, ball-placing and printing. The conductive frame 600 is formed by metals having electric conductivity such as copper, copper alloy, iron and nickel. The conductive frame 600 is generally a plate and has a metal (or metal alloy) that can be engaged with tin such as tin, silver, tin-silver-copper alloy, nickel and nickel alloy coating thereon.

Figure 5:
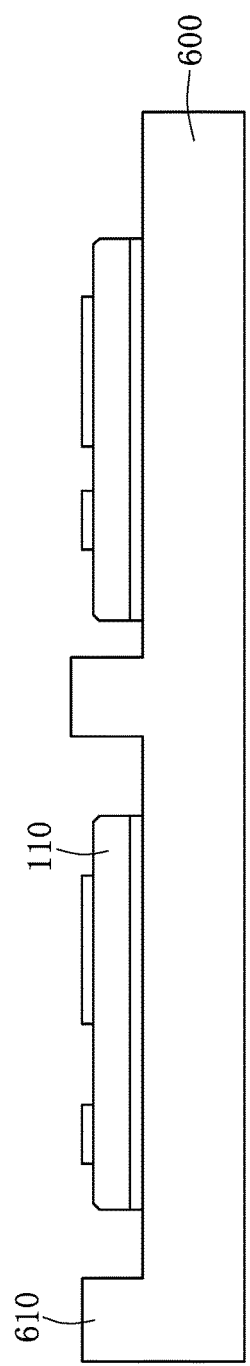
FIG. 5 is a first process schematic view of the conductive frame of the semiconductor package structure and the manufacturing method thereof provided by the instant disclosure.
Figure 6:
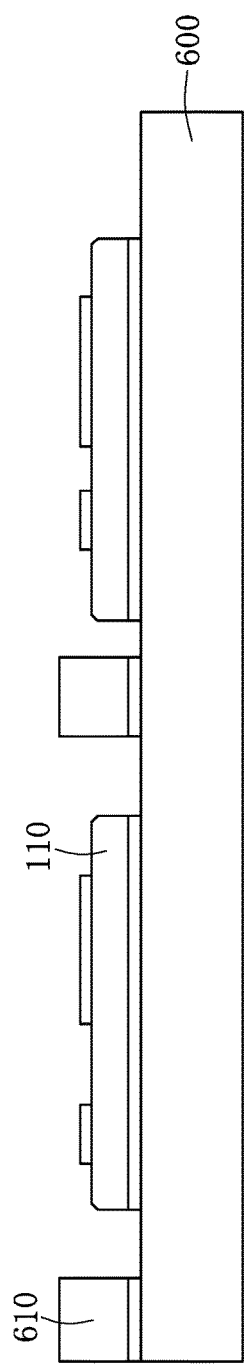
FIG. 6 is a second process schematic view of the conductive frame of the semiconductor package structure and the manufacturing method thereof provided by the instant disclosure.
Figure 7:
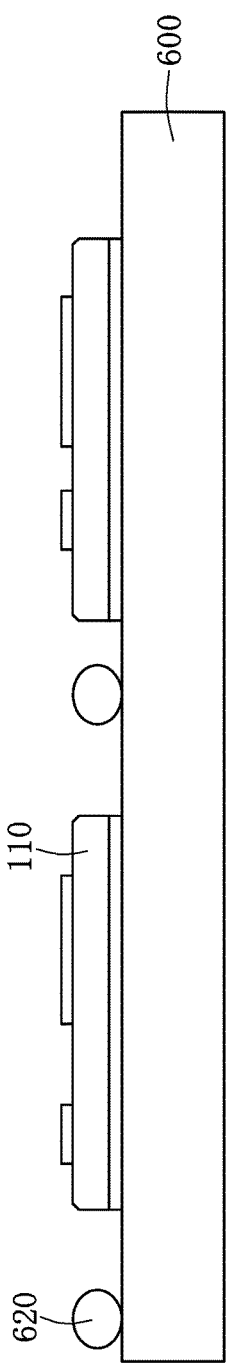
FIG. 7 is a third process schematic view of the conductive frame of the semiconductor package structure and the manufacturing method thereof provided by the instant disclosure.
Figure 8:
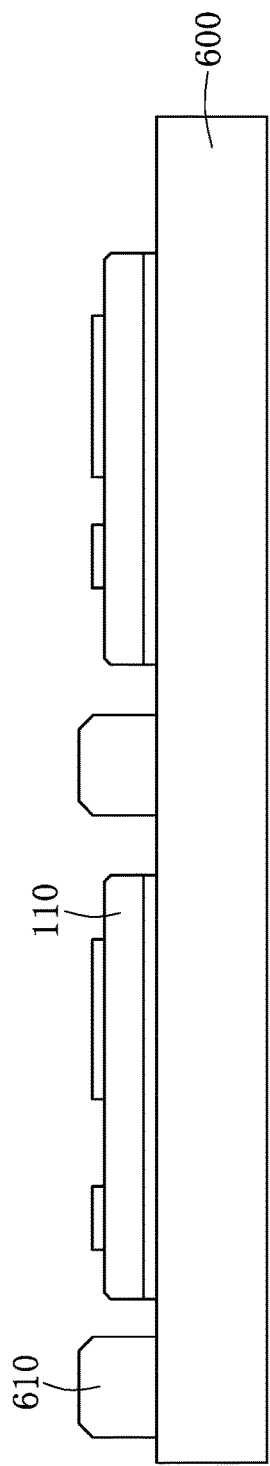
FIG. 8 is a fourth process schematic view of the conductive frame of the semiconductor package structure and the manufacturing method thereof provided by the instant disclosure.
Figure 9:
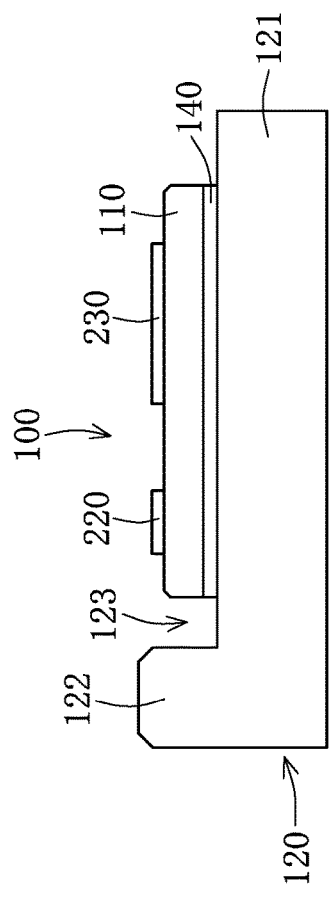
FIG. 9 is a schematic view of the first surface mounting element of the semiconductor package structure and the manufacturing method thereof provided by the instant disclosure.

As shown in FIG. 5, the process for forming the metal member in step S110 includes forming the metal member 610 having a metal bump shape on the conductive frame 600 by etching or stamping. The metal bump is for guiding the drain on the back side of the chip to the same surface with the source and gate on the front side of the chip and electrically connecting the drain with the circuit board. As shown in FIG. 6, alternatively, using a binding method such as chip bonding to bind the metal member 610 on the conductive frame 600. As shown in FIG. 7, the ball-placing process can be used, i.e., using wire bonder ball placing technique to fix the ball-shape metal bump 620 on the conductive frame 600. As shown in FIG. 8, Conductive bumps 610 can be sprayed or attached on the conductive frame 600 by conductive thin films. Solder, conductive paste or sintering silver paste also can be placed on the conductive frame 600 by the stencil printing or ball drop process. As shown in FIG. 9, cutting the conductive frame 600 to form the first surface mounting element 100 comprising the first conductive frame 120 and the first chip 110.

In step S112, fixing the chip on the conductive frame. As shown in FIG. 5 to FIG. 8, using one of a dispending process, soldering process, screen-printing process, or eutectic soldering process along with a conductive film to fix the first surface mounting element 100 on the first conductive frame 120 through a binder material having conductivity. The binder material having conductivity is the conductive layer 140 between the first surface mounting element 100 and the first conductive frame 120, and can be formed by a silver paste, nanosilver, sintering silver, tin paste or copper paste, etc. The first surface mounting element 100 is not limited to a single chip or chips of the same type and can be the combination of a plurality of IGBT or MSFET chips which are arranged in parallel to a plurality of FRDs. Lastly, completing the discrete power element packaging by cutting and separating processes. As shown in FIG. 9, the cut and separated power elements are referred to as prepackaged discrete power elements. Next, more comprehensive testing and electrical parameter matching and filtering can be performed.

Figure 3:
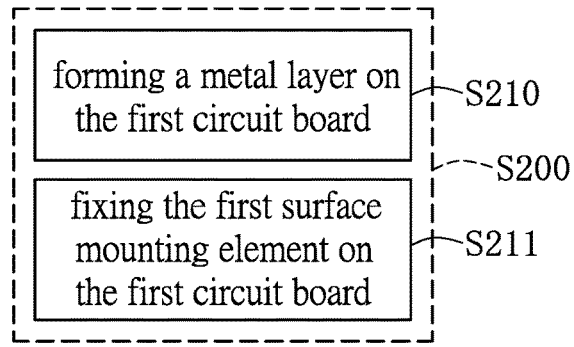
FIG. 3 is a third flow chart of the method for manufacturing a semiconductor package structure provided by the instant disclosure.

Please refer to FIG. 3. Step S200 further comprises: step S210, forming the metal layer on the first circuit board; and step S211, fixing the first surface mounting element on the first circuit board.

Figure 10:
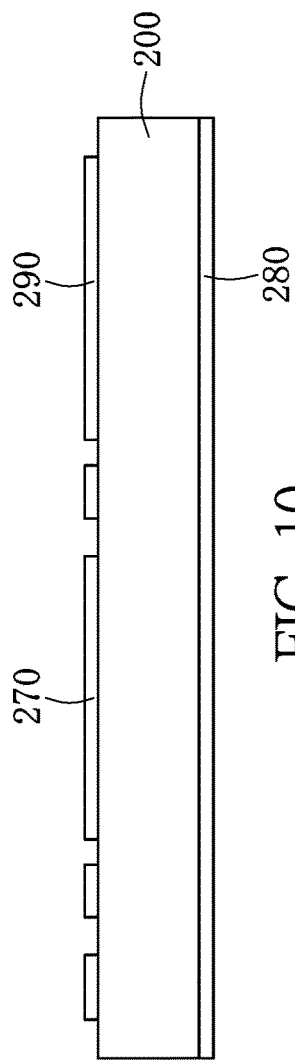
FIG. 10 is a schematic view of the first circuit board of the semiconductor package structure and the manufacturing method thereof provided by the instant disclosure.

Please refer to FIG. 10. In step S210, the conductive metal layer 270 is engaged to the first circuit board 200 by a hot press attaching process or a plating process. The first circuit board 200 is the substrate for carrying the elements and can be formed by insulating ceramics or metal core printed circuit boards (MCPCB). Taking the insulating ceramics as an example, the material forming the conductive metal layer 270 is generally copper (Cu) or aluminum (Al). By attaching the conductive metal layer 270 on the first circuit board 200 which is an insulating ceramic through the hot press attaching process or the plating process, electrical and mechanical connections and heat dissipation paths are established. The conductive metal layer 270 can be engaged to the first circuit board 200 by other processes such as direct bonding copper (DBC), direct aluminum bonding (DAB) or active metal brazing (AMB).

The insulating ceramics can be selected from $Al_2O_3$, $Si_3N_4$, AlN, AlSiC, etc. The first circuit board 200 can has a single metal layer or has metal layers on both surfaces such as the conductive metal layer 270 and the first conductive metal layer 280, the former acts as the circuit area on the first circuit board 200 and the later acts as a heat dissipations metal layer.

In step S211, the first surface mounting element is fixed on the first circuit board. Please refer to FIG. 11. Step S211 employs surface mounting technology (SMT) to arrange and solder the first surface mounting element 100, the second surface mounting element 800, the electrical connecting terminal 1000 and other elements (not shown) on the first circuit board 200. FIG. 11 only shows the half bridge circuit for description convenience, in which the first surface mounting element 100 is an upper bridge power element and the second surface mounting element 800 is a lower bridge power element.

Figure 12:
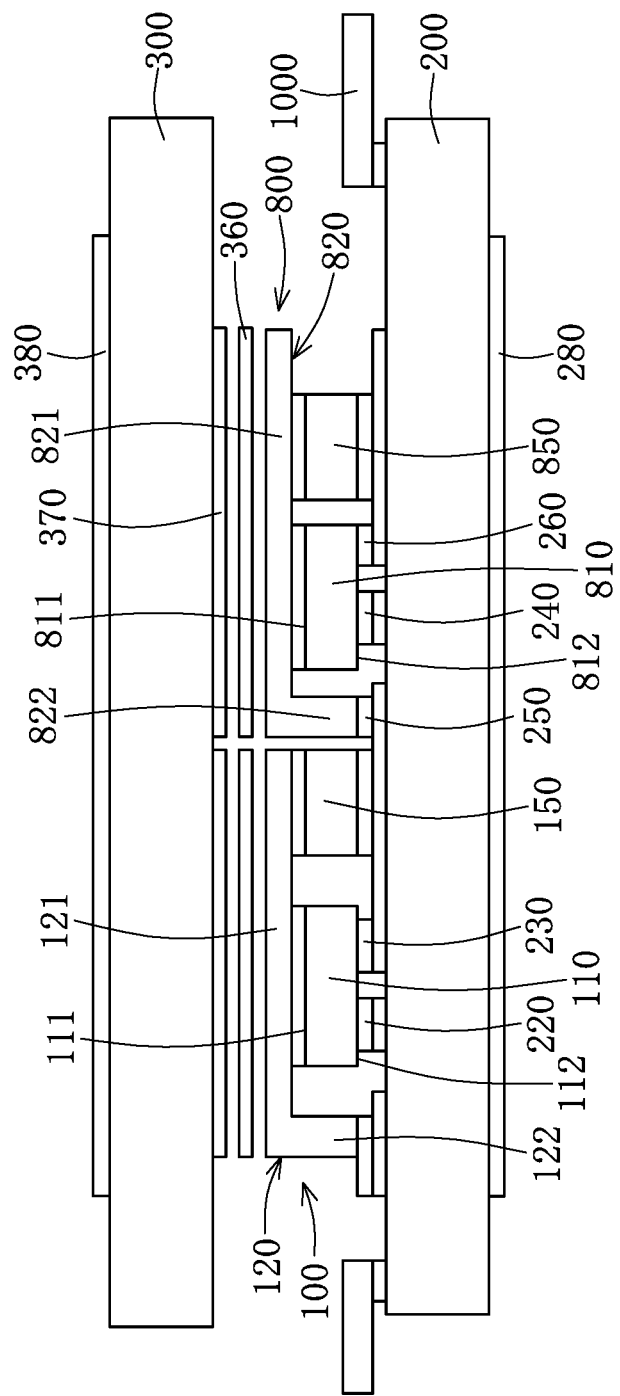
FIG. 12 is a second schematic view of the semiconductor package structure provided by the instant disclosure.
Figure 13:
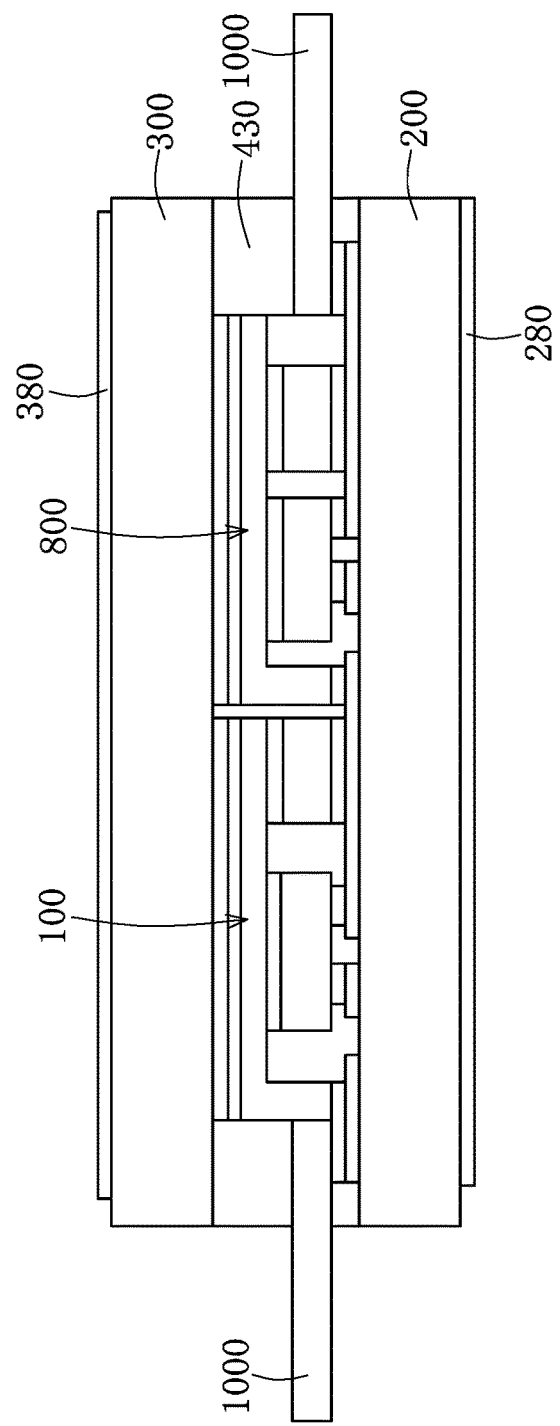
FIG. 13 is a third schematic view of the semiconductor package structure provided by the instant disclosure.

Please refer to FIG. 11 to FIG. 13. Each surface mounting element comprises at least a power chip. The first chip 110 is a MOSFET or an IGBT, and in the present embodiment, the first chip 110 is an IGBT. The collector on a side of the first chip 110 is electrically connected to the first pad 210 through the first conductive frame 120, and the gate and the emitter on the other side of the first chip 110 are electrically connected to the second pad 220 and the third pad 230. The first pad 210, the second pad 220 and the third pad 230 are located on the same side of the first circuit board 200, and a first enhancing chip such as a power diode or an FRD chip is arranged inside the first surface mounting element 100. In the instant disclosure, the first enhancing chip is an FRD chip 150. The FRD chip 150 is for enhancing the performance of the circuit, the first chip 100 and the FRD chip 150 are packaged in the first surface mounting element 100 at the same time, and the source of the first chip 110 and the anode of the FRD chip 150 are connected to each other by the conductive metal layer 270 on the first circuit board 200. Specifically, the first reinforce chip is connected to the second side 112 of the first chip 110 through the metal layer 270 on the first circuit board 200.

Similarly, the low side bridge second surface mounting element 800 has a FRD chip 850 therein for enhancing the performance of the circuit, the second chip 810 and the FRD chip 850 are packaged in the second surface mounting element 800, and the emitter of the second chip 810 and the anode of the FRD chip 850 connect the circuits by the first combination layer 290 (a metal layer) on the first circuit board 200. The collector on a side of the second chip 810 is electrically connected to the fifth pad 250 through the second conductive frame 820, and the gate on the other side of the second chip 810 corresponds to the fourth pad 240 and the emitter corresponds to the sixth pad 260. The fifth pad 250, the fourth pad 240 and the sixth pad 260 are located on the same plane of the first circuit board 200.

Furthermore, the second surface mounting element 800 comprises the second conductive frame 820 and the second chip 810. The second conductive frame 820 comprises the second carrier board 821 and the second metal member 822, the second carrier board 821 and the second metal member 822 connect with each other and form the second receiving area 823. The second chip 810 is located in the second receiving area 823, and the first side 811 of the second chip 810 is electrically connected to the second carrier board 821. The second metal member 822 extends from the second carrier board 821 along a direction from the first side 811 of the second chip 810 to the second side 822 of the second chip 810. The second side 812 of the second chip 810 and the second metal member 822 are connected to the first circuit board 200 through the fourth pad 240 and the fifth pad 250 respectively.

The connecting point of the first surface mounting element 100 and the second surface mounting element 800 is the phase output of the single phase half-bridge, and the first surface mounting element 100 and the second surface mounting element 800 are connected with each other by using the conductive metal layer 270 to connect the emitter of the upper bridge (high side) though the third pad 230 with the fifth pad 250 of the collector of the lower bridge (low side), thereby forming a phase output. Other devices such as passive devices, Bootstrap diodes, driving IC devices, pre-assembled power devices and electronic terminal devices are arranged and fixed on the first circuit board 200 through surface mounting technique (SMT), and the first circuit board 200 with the above-mentioned devices is transferred into a solder oven for melting and curing processes.

Afterward, performing the electrical connection test and function test of the first circuit board 200 for removing defective products.

Since the driving devices are often provided in the form of dies, the IC chip can be wire-bonded on the first circuit board 200 for generating an electrical connection, and can be protected by an adhesive-dispensing process. In addition to a welding process, the electrical connecting terminal 1000 and the signal terminal can be welded on the metal layer of the insulating ceramic substrate through ultrasonic welding.

In step S300, providing the second circuit board. Please refer to FIG. 12. The second circuit board 300 is substantially the same as the first circuit board 200 and comprises the second conductive layer 370 and the second heat conducting metal layer 380. The second conductive layer 370 is the circuit of the second circuit board 300 and the conductive paste 360 can be a solder for fixing the second circuit board 300 with the first surface mounting element 100 and that of the second surface mounting element 800. The drain electric potential of the first surface mounting element 100 and the second surface mounting element 800 are different and hence, the circuits electrically connected to the first surface mounting element 100 and the circuit electrically connected to the second surface mounting element 800 of the second conductive layer 370 are insulated from each other. After the curing process, the second circuit board 300 is assembled with the components shown in FIG. 11 for forming a sandwich structure. The structure has a double-sided heat dissipation property.

In step S400, forming an electrical connecting terminal (the electrical connecting terminal 1000 shown in FIG. 11). In step S500, forming a closed loop metal ring disposed between the first circuit board 200 and the second circuit board 300 and surrounding the first surface mounting element 100, thereby preventing electromagnetic interference (EMI). The details of step S500 will be described further on. In step S600, performing a packaging process. As shown in FIG. 13, coating a fixing paste 430 around the edge of the final product and between the first circuit board 200 and the second circuit board 300 for reinforcing the bonding between the upper and lower substrate and providing an excellent moisture-proof property. Accordingly, the lifetime of the final product is increased.

Figure 14:
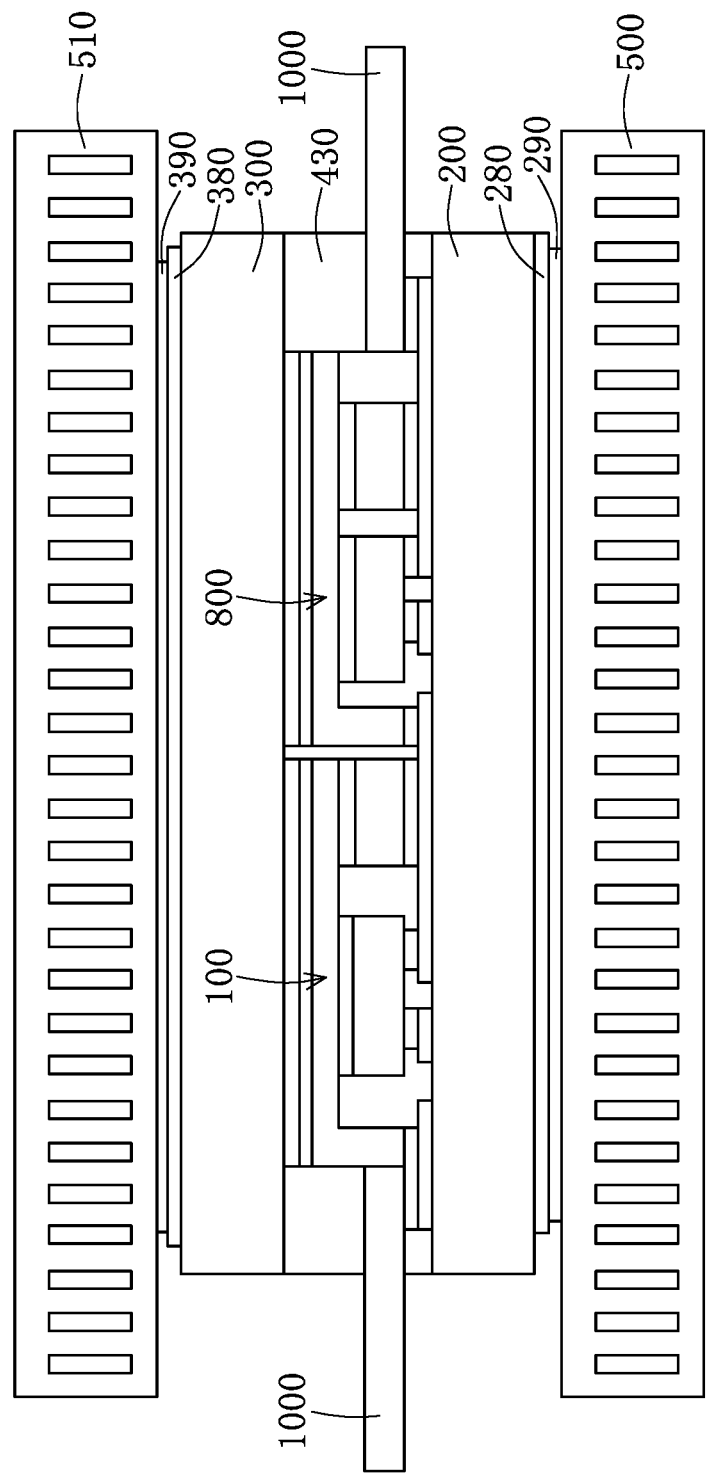
FIG. 14 is a fourth schematic view of the semiconductor package structure provided by the instant disclosure.
Figure 16:
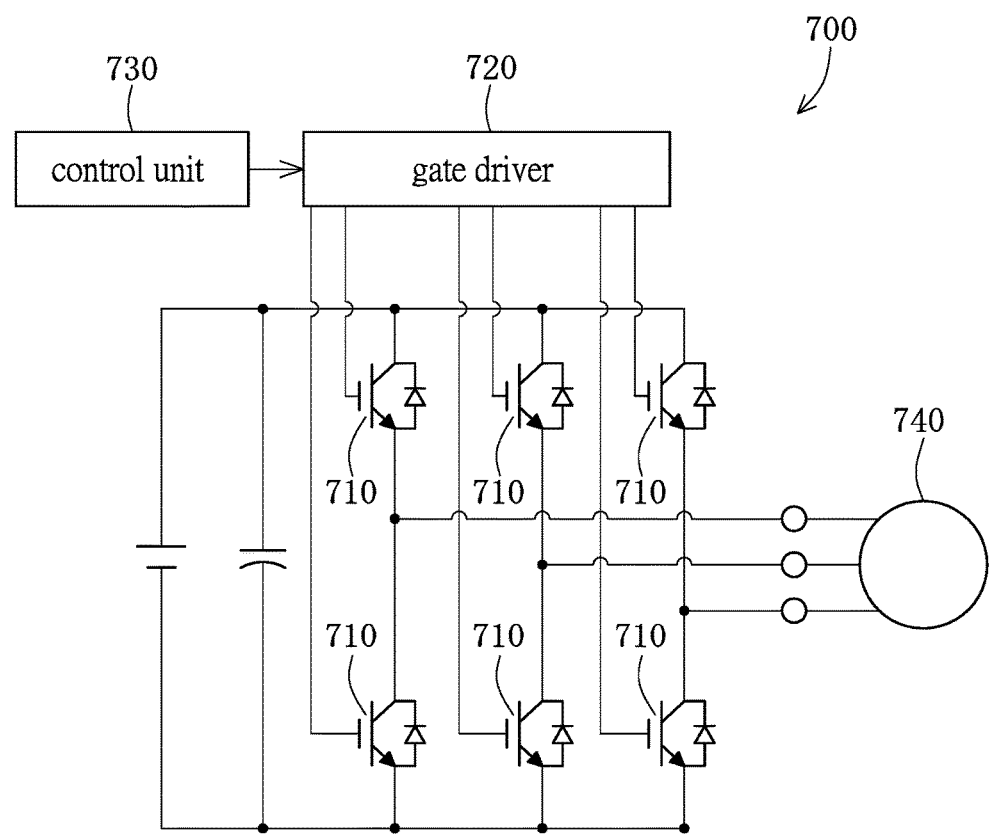
FIG. 16 is a schematic view showing the application of the semiconductor package structure and the manufacturing method thereof provided by the instant disclosure in a circuit.

In an embodiment of the instant disclosure, a heat dissipation plate is further provided for providing a good heat dissipation property. Please refer to FIG. 14. The method for manufacturing a semiconductor package structure provided by the instant disclosure is suitable for applications of high electric power and high electric current. As shown in FIG. 16, the power module 700 comprises a plurality of power devices 710 and hence, a large amount of heat is generated during the operation of the power module 700. Therefore, there is a need for providing a suitable heat dissipation media to release the heat generated by the chips. The semiconductor package structure of the instant disclosure is a thin sandwich structure and is suitable for adding or arranging heat dissipation devices of different types, such as slot-type heat dissipation devices (for example, a heat dissipation plate). The addition or arrangement of a heat dissipation device comprises the steps of: forming a first conductive metal layer 280 on the first circuit board 200; forming a second heat conducting metal layer 380 on the second circuit board 300; attaching the first heat dissipation plate 500 on the first conductive metal layer 280 and attaching a second heat dissipation plate 510 on the second heat conducting metal layer 380.

The first heat dissipation plate 500 and the second heat dissipation plate 510 can be made of metal materials such as copper or aluminum, and materials having relative high thermal conductivity such as tin paste can be used as the first combination layer 290 and the second combination layer 390, thereby reinforcing the bonding between the first heat dissipation plate 500 and the first circuit board 200, and the bonding between the second heat dissipation plate 510 and the second circuit board 300. Therefore, a minimum heat conductive path and a low thermal resistance are achieved, and the heat dissipation performance of the final product is significantly increased.

Figure 4:
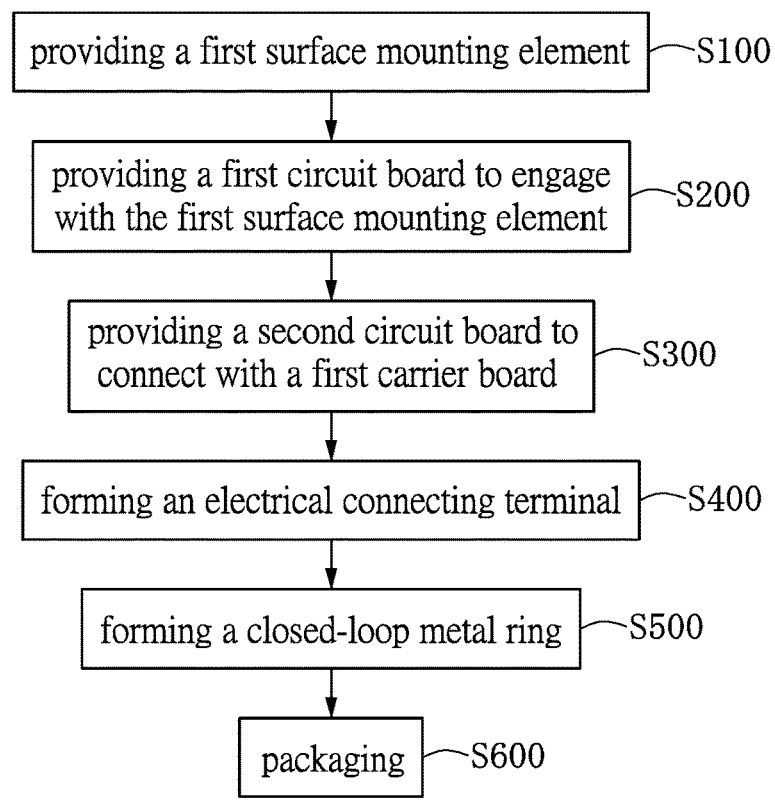
FIG. 4 is a fourth flow chart of the method for manufacturing a semiconductor package structure provided by the instant disclosure.
Figure 15:
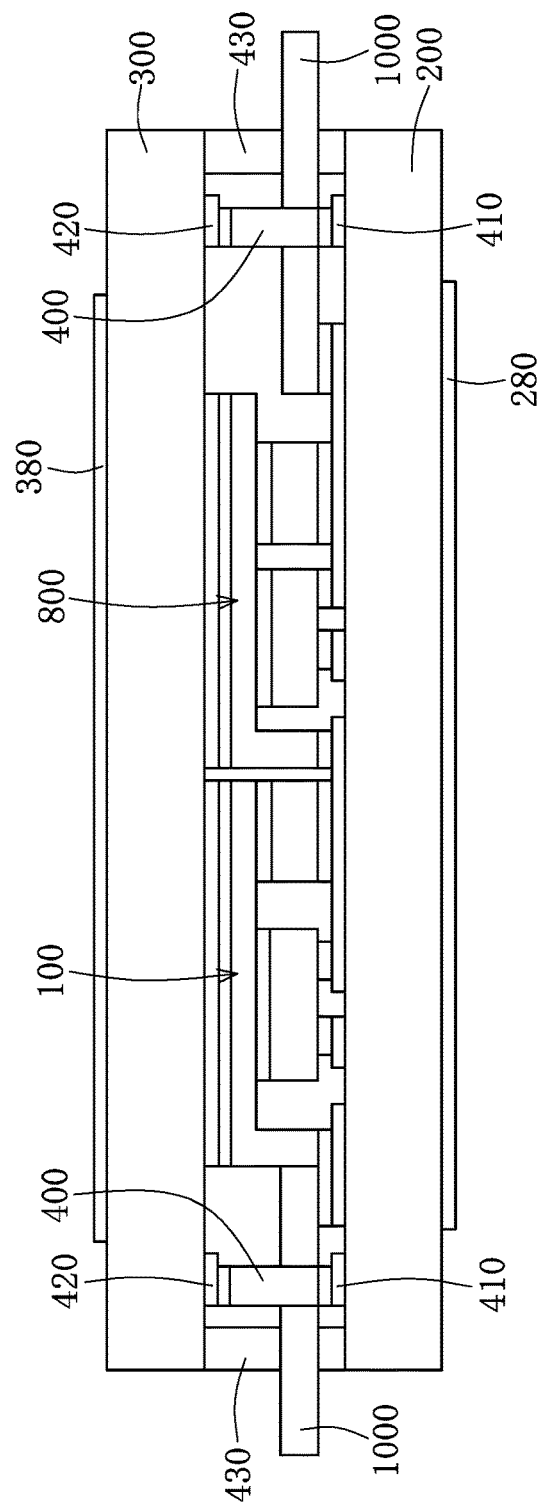
FIG. 15 is a schematic view of another embodiment of the semiconductor package structure and the manufacturing method thereof provided by the instant disclosure.

Regarding step S500, please refer to FIG. 4 and FIG. 15. In order to prevent EMI, forming a closed loop metal ring between the first circuit board 200 and the second circuit board 300 and surrounding the first surface mounting element 100. The closed loop metal ring further comprises a first closed-loop metal ring 410, a second closed-loop metal ring 420, and a metal column 400.

Specifically, step S500 comprises: providing the first closed-loop metal ring 410, the first closed-loop metal ring 410 is disposed on the peripheral edge of the first circuit board 200 and encloses all of the electronic components in the first closed-loop metal ring 410; providing the second closed-loop metal ring 420, the second closed-loop metal ring 420 is disposed on the peripheral edge of the second circuit board 300 and encloses all of the electronic components in the second closed-loop metal ring 420; providing the metal column 400 disposed between the first circuit board 200 and the second circuit board 300, and the two ends of the metal column 400 are electrically connected to the first closed-loop metal ring 410 and the second closed-loop metal ring 420 respectively. The metal column 400, the first closed-loop metal ring 410 and the second closed-loop metal ring 420 can be connected to suitable electric potential points such as an electric spot, thereby providing the function of preventing EMI.

Please refer to FIG. 11 to FIG. 16. The method for manufacturing a semiconductor package structure of the instant disclosure further comprises the following steps. Providing a second surface mounting element 800 comprising a second chip 810 and a second conductive frame 820, in which the second conductive frame 820 comprises a second carrier board 821 and a second metal member 822 connected to the second carrier board 821, as shown in FIG. 11. The second carrier board 821 and the second metal member 822 form a second receiving area 823. The second chip 810 is located in the second receiving area 823, a side of the second chip 810 is electrically connected to the second carrier board 821 of the second conductive frame 820, and the second metal member 822 of the second conductive frame 820 is located at the side edge of the second chip 810. In other words, the second side 812 of the second conductive frame 820 is electrically connected to the second carrier board 821, and the second metal member 822 and the second side 812 of the second chip 810 are on the same side.

Next, fixing the second surface mounting element 800 on the first circuit board 200. The first side 811 of the second chip 810 is electrically connected to the fifth pad 250 through the second conductive frame 820, the second side 812 of the second chip 810 is electrically connected to the fourth pad 240 and the sixth pad 260, and the third pad 230, the fourth pad 240 and the fifth pad 250 are located on the same plane of the first circuit board 200. In other words, the second side 812 of the second chip 810 and the second metal member 822 are connected to the first circuit board 200 through the fifth pad 250, and the fourth pad 240 and the sixth pad 260 respectively.

As shown in FIG. 13, attaching a side of the second surface mounting element 800 to the second circuit board 300, the second surface mounting element 800 is located between the first circuit board 200 and the second circuit board 300.

The above-mentioned descriptions represent merely the exemplary embodiment of the instant disclosure, without any intention to limit the scope of the instant disclosure thereto. Various equivalent changes, alterations or modifications based on the claims of the instant disclosure are all consequently viewed as being embraced by the scope of the instant disclosure.

What is claimed is:

1. A method for manufacturing a semiconductor package structure comprising:
   providing a first surface mounting element comprises a first chip and a first conductive frame, wherein the first conductive frame comprises a first carrier board and a first metal member, the first carrier board and the first metal member connect with each other to form a first receiving area, the first chip is located in the first receiving area, and a first side of the first chip is electrically connected to the first carrier board;
   providing a first circuit board to engage with the first surface mounting element, wherein the first metal member and a second side of the first chip are connected to the first circuit board through a first pad and a second pad respectively; and
   providing a second circuit board to connect with the first carrier board, the first surface mounting element is located between the first circuit board and the second circuit board.

2. The method according to claim 1, wherein the first pad and the second pad are connected to a same surface of the first circuit board.

3. The method according to claim 1, wherein the first surface mounting element further comprises a first enhancing chip connected to the second side of the first chip through a metal layer on the first circuit board.

4. The method according to claim 1, wherein after the step of providing the second circuit board, further comprising:
   forming a closed-loop metal ring disposed between the first circuit board and the second circuit board, and the closed-loop metal ring surrounds the first surface mounting element.

5. The method according to claim 1, wherein after the step of providing the second circuit board, further comprising:
   coating a fixing paste between the first circuit board and the second circuit board.

6. The method according to claim 1, wherein before the step of providing the first surface mounting element, further comprising:
   forming the first metal member on the first conducting frame through one of an etching process, an impact molding process, a binding process, a ball-placing process and a printing process.

7. The method according to claim 1, further comprising:
providing a second surface mounting element including a second chip and a second conductive frame, wherein the second conductive frame includes a second carrier board and a second metal member, the second metal member is connected to the second carrier board to form a second receiving area, the second chip is disposed in the second receiving area, and a first side of the second chip faces to the second carrier board;
fixing the second surface mounting element on the first circuit board, wherein the first side of the second chip and the first side of the first chip face a same direction;
attaching a side of the second surface mounting element to the second circuit board, wherein the second surface mounting element is located between the first circuit board and the second circuit board.

8. The method according to claim 7, wherein the first side of the second chip is electrically connected to the second carrier board, and the second metal member and a second side of the second chip are connected to the first circuit board through a third pad and a fourth pad respectively.

* * * * *